(12) United States Patent
Sarkisian et al.

(10) Patent No.: US 8,898,051 B2
(45) Date of Patent: Nov. 25, 2014

(54) SYSTEM AND METHOD FOR IMPLEMENTING A TRACE INTERFACE

(75) Inventors: Arthur Perry Sarkisian, Tillson, NY (US); Jingbo Gao, Saratoga, CA (US); Tsair-Chin Lin, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 308 days.

(21) Appl. No.: 12/814,355

(22) Filed: Jun. 11, 2010

(65) Prior Publication Data
US 2010/0318338 A1 Dec. 16, 2010

Related U.S. Application Data (60) Provisional application No. 61/186,712, filed on Jun. 12, 2009.

(51) Int. Cl.
*G06F 17/50* (2006.01)

(52) U.S. Cl.
CPC ........ *G06F 17/5022* (2013.01); *G06F 17/5045* (2013.01); *G06F 17/5027* (2013.01)
USPC ............................... 703/23; 717/138; 712/227

(58) Field of Classification Search
CPC ............ G06F 17/5022; G06F 17/5027; G06F 17/5045
USPC .................. 703/23; 709/1; 717/138; 712/227
See application file for complete search history.

(56) References Cited

U.S. PATENT DOCUMENTS

| | | | |
|---|---|---|---|
| 5,036,473 A | 7/1991 | Butts et al. | |
| 5,109,353 A | 4/1992 | Sample et al. | |
| 5,425,036 A * | 6/1995 | Liu et al. | 714/735 |
| 5,475,830 A | 12/1995 | Chen et al. | |
| 5,551,013 A | 8/1996 | Beausoleil et al. | |
| 5,678,030 A * | 10/1997 | Sferrazza et al. | 703/23 |
| 5,680,583 A * | 10/1997 | Kuijsten | 703/23 |
| 5,960,191 A | 9/1999 | Sample et al. | |
| 6,035,117 A | 3/2000 | Beausoleil et al. | |
| 6,051,030 A | 4/2000 | Beausoleil et al. | |
| 6,389,379 B1 | 5/2002 | Lin et al. | |
| 6,556,936 B2 * | 4/2003 | Gooding et al. | 702/115 |
| 6,651,225 B1 * | 11/2003 | Lin et al. | 716/113 |
| 6,754,763 B2 * | 6/2004 | Lin | 710/317 |
| 6,901,581 B1 * | 5/2005 | Schneider | 717/124 |

(Continued)

OTHER PUBLICATIONS

Park et al., "Improve Debugging and Performance Tuning With ETW", Apr. 2007, MSDN Magazine, accessed on Sep. 20, 2013, accessed from <http://msdn.microsoft.com/en-us/magazine/cc163437.aspx>, pp. 1-12.*

*Primary Examiner* — Patrick Riegler
*Assistant Examiner* — Nicholas Klicos
(74) *Attorney, Agent, or Firm* — Dickstein Shapiro LLP (57) ABSTRACT

A system and method for selectively capturing and storing emulation data results from a hardware emulation system, which reduces the data bandwidth requirement and the unnecessary consumption of the DRAM memory capacity by uninteresting data. According to one embodiment, a system comprises a trace array for storing one or more frames of data; a first set of hardware control bits that enables the trace array to selectively capture non-continuous windows of data within a frame of data; a data capture card; and a second set of hardware control bits that enables the data capture card to capture a select frame of data from the one or more frames of data stored on the trace array.

16 Claims, 5 Drawing Sheets

(56) References Cited

U.S. PATENT DOCUMENTS

| | | | |
|---|---|---|---|
| 6,912,675 B2* | 6/2005 | Swoboda | 714/45 |
| 6,985,848 B2* | 1/2006 | Swoboda et al. | 703/26 |
| 7,103,530 B1* | 9/2006 | Bartz et al. | 703/27 |
| 7,290,228 B2* | 10/2007 | Guenther et al. | 716/106 |
| 7,325,164 B2* | 1/2008 | Swanson et al. | 714/30 |
| 7,379,860 B1* | 5/2008 | Bartz et al. | 703/28 |
| 7,581,139 B2* | 8/2009 | Agarwala | 714/27 |
| 7,653,848 B2* | 1/2010 | Abernathy et al. | 714/724 |
| 7,739,093 B2* | 6/2010 | Beausoleil et al. | 703/14 |
| 7,930,165 B2* | 4/2011 | Weiss et al. | 703/28 |
| 2002/0152060 A1* | 10/2002 | Tseng | 703/17 |
| 2004/0148153 A1* | 7/2004 | Beletsky et al. | 703/27 |
| 2004/0153304 A1* | 8/2004 | Agarwala et al. | 703/26 |
| 2004/0153813 A1* | 8/2004 | Swoboda | 714/36 |
| 2005/0267732 A1* | 12/2005 | Beausoleil et al. | 703/28 |
| 2006/0117274 A1* | 6/2006 | Tseng et al. | 716/1 |
| 2007/0226795 A1* | 9/2007 | Conti et al. | 726/22 |
| 2009/0106604 A1* | 4/2009 | Lange et al. | 714/45 |

\* cited by examiner

SYSTEM AND METHOD FOR IMPLEMENTING A TRACE INTERFACE

The present application claims the benefit of and priority to U.S. Provisional Patent Application No. 61/186,712 filed on Jun. 12, 2009, entitled "Method and System for Improving Simulation Acceleration," which is herein incorporated by reference.

FIELD

The present system and method relate to simulation acceleration, and particularly, to implementing a trace/capture interface for simulation acceleration.

BACKGROUND

Electronic design automation (EDA) tools are used for designing, verifying, and implementing electronic systems and component circuits. Within an electronic system, hundreds of integrated circuits, or "chips", may be interconnected on one or more printed circuit boards (PCBs). Today, an integrated circuit can easily comprise billions of interconnected transistors to enable a set of intended functions. Without EDA tools, it would be impractical, if not impossible, to produce and commercialize an integrated circuit of such complexity. Integrated circuits continue to become more complex (i.e., increasing number of transistors) with each successive generation of process technology, allowing more transistors to exist on a footprint of the same or smaller size. Increase in complexity generally translates to longer times for designing, verifying, and implementing a chip design. There exists a need for advances in EDA tool technology to keep chip development within a competitive timeline.

The design process for an integrated circuit generally entails describing the circuit's intended behavior at the register transfer level (RTL) using a hardware description language, such as VHDL, or Verilog, and then reducing the RTL design description into a physical layout of transistor gates. However, because the design is implemented to describe the functions of, perhaps, millions or billions of interconnected transistors, errors may be inevitable. Thus, the design needs to be verified to ensure that it behaves exactly the way the designers intended. One possible approach is to reduce the RTL code to a physical layout, fabricate a prototype chip, and then test it in the intended environment. However, the impracticality of such an approach goes without saying in the industry, given the turnaround time, the cost of manufacturing, and the number of design revisions that may be required to perfect the design.

Today, verification engineers utilize a range of EDA tool technologies for logic verification that are far more practical than prototyping. One such technology is software simulation, which refers to running an RTL design through a computer program, a "software simulator", on a general purpose computer or workstation to simulate the operations of the circuit design. Even though software simulation offers faster turnaround time compared to manufacturing an actual device, simulating a complex circuit design can still be painstakingly slow and can take up to months or more to finish. Indeed, it can take many hours or even several days to simulate just a small number of clock cycles of a typical design if a software simulator is used. This is because a typical workstation relies on a single processor to simulate these operations in a sequential or semi-sequential manner. In contrast, most of the operations on a fabricated chip are performed in parallel.

Hardware emulation is a logic verification technology that typically offers the fastest verification speed because a considerable number of operations may be performed in parallel. Parallel execution is achieved by mapping substantially the entire circuit design onto the emulation resources of a hardware platform. Additionally, with hardware emulation, the hardware platform can run almost independently from a workstation because almost all of the verification environment is placed on the hardware platform. Without having to wait for data input from the workstation, the user's design running in the emulator can operate at substantially full hardware speeds. However, the speed enhancement is not without cost. Because almost the whole design would need to be mapped onto the hardware platform, the complexity of the design is generally limited by the emulation resource capacity of the hardware platform.

Simulation acceleration offers a middle ground in terms of verification speed and emulation capacity between software simulation and hardware emulation by separately executing a software portion and a hardware portion of the design. Code apportionment is performed by a compiler in a workstation at compile time. The hardware portion of the design is mapped onto the emulation resources of the hardware emulation system, which executes the code in a substantially parallel manner, while the software portion of the design runs in the software simulator on the workstation. The workstation is connected to and works in conjunction with the hardware platform to verify the circuit logic through the exchange of simulation data. Because the hardware platform may have to wait for data input from the workstation, verification speed is determined in part by the percentage of the design remaining on the workstation and the communication channel width and latency between the workstation and the hardware platform.

SUMMARY

A system and method for selectively capturing and storing emulation data results from a hardware emulation system. According to one embodiment, a system comprises a trace array for storing one or more frames of data; a first set of hardware control bits that enables the trace array to selectively capture non-continuous windows of data within a frame of data; a data capture card; and a second set of hardware control bits that enables the data capture card to capture a select frame of data from the one or more frames of data stored on the trace array.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

Hardware emulation systems and simulation acceleration systems are collectively referred to as emulation systems in the subsequent sections. Such emulation systems are commercially available from various vendors, such as Cadence Design Systems, Inc. headquartered in San Jose, Calif.

Typical emulation systems utilize either interconnected programmable logic chips or interconnected processor chips. Examples of hardware logic emulation systems using programmable logic devices are disclosed in, for example, U.S. Pat. No. 5,109,353, entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 5,109,353, 5,036,473, 5,475,830 and 5,960,191 are incorporated herein by reference. Examples of hardware logic emulation systems using processor chips are disclosed in, for example, U.S. Pat. No. 5,551,013 entitled "Multiprocessor for hardware emulation," U.S. Pat. No. 6,035,117 entitled "Tightly coupled emulation processors," and U.S. Pat. No. 6,051,030 entitled "Emulation module having planar array organization." U.S. Pat. Nos. 5,551,013, 6,035,117 and 6,051,030 are incorporated herein by reference.

While mapping all or a portion of a logic design onto a hardware platform provides an advantage in terms of the verification speed, it also provides a disadvantage in terms of debug visibility. Unlike simulating a logic design on a general purpose computer or workstation, which usually provides an interface (e.g., computer monitor and keyboard) for the verification engineer to monitor and interact with the logic design, there are usually no readily available interfaces on the hardware platform for monitoring or interacting with the intermediate states of the logic design as it is being verified on. Without being able to observe and analyze the intermediate states of a logic design that is being verified, debugging the logic design would seem to be an almost impossible task. One approach was to provide a tracing capability. The tracing capability allowed verification engineers to setup data capture windows in which a fourth of all the emulation data may be captured continuously within that window of time and stored into a DRAM module. These emulation data could then be uploaded to a workstation for analysis at a later time.

There are, however, at least two drawbacks to this approach. First, capturing emulation data continuously requires considerable bandwidth for transferring and storing the data at each emulation step. Historically, satisfying this bandwidth requirement was possible by having an on-chip DRAM module. However, implementing the DRAM module on the same ceramic glass substrate as the emulation processors can be very costly. Thus, it is desirable to implement the DRAM module separate from the chip, which necessitates reducing the bandwidth requirement of the tracing capability. Second, a large amount of DRAM memory is generally needed to capture even just a small window of data because once acquisition begins, data are continuously acquired and stored into the DRAM module until the end of the specified window of time or until the DRAM module became full. This often times resulted in collecting considerable uninteresting data that were not of interest to the verification engineer, data that may consume the memory capacity of the DRAM module considerably.

In view of the foregoing, there exists a need for a system and method for selectively capturing and storing emulation data results from hardware emulation resources, which reduces the data bandwidth requirement and the unnecessary consumption of the DRAM memory capacity by uninteresting data.

Figure 1:
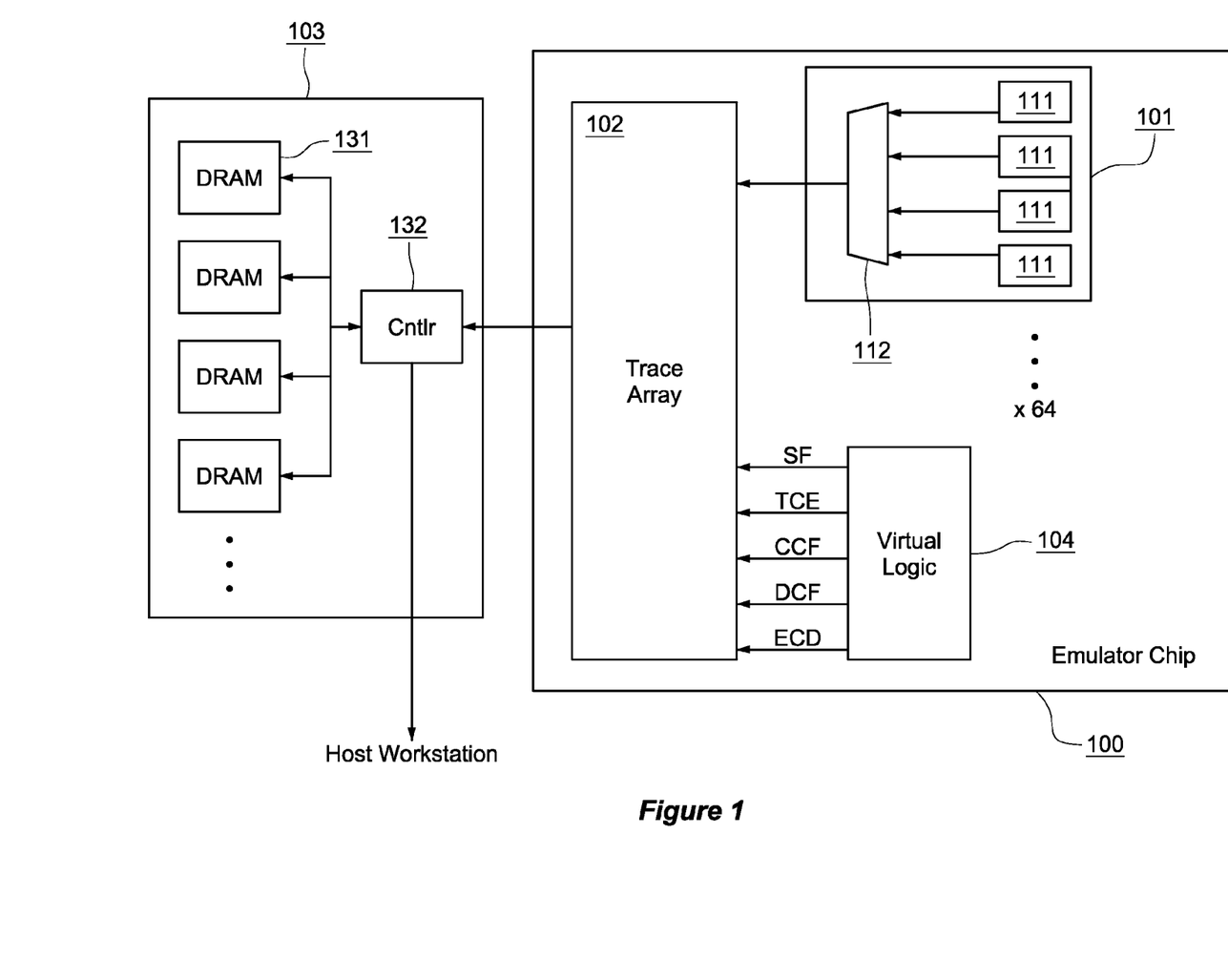
FIG. 1 illustrates an exemplary trace/capture interface (TCI) for selectively capturing and storing emulation data results from emulation processor clusters on an emulator chip, according to one embodiment.

The system and method presently disclosed is a trace/capture interface (TCI) for selectively capturing and storing emulation data results from a hardware emulation system, which reduces the data bandwidth requirement and the unnecessary consumption of the DRAM memory capacity by uninteresting data. The TCI provides the path for selected user signals values to be stored for later upload to a workstation where waveforms can be reconstructed and displayed for a user. FIG. 1 illustrates an exemplary TCI for selectively capturing and storing emulation data results from emulation processor clusters 101 on an emulator chip 100. As shown, each emulation processor cluster 101 includes four emulation processors 111. There is also a 4-way mux 112 in every processor cluster 101 that selects one of the four processor output signals. The selected processor output signal is driven to the trace array memory 102.

In the illustrated embodiment, there are 64 processor clusters 101. Thus, there are 64 processor output signals connected to the trace array memory 102 and 64 bits of data may be captured at a time during any emulation step. The trace array memory 102 may be implemented using two single-ported SRAM having memory dimensions 2048×66 (64 bits+2 parity bits). Emulation data acquired from the processor clusters 101 are held temporarily in the trace array 102 until a control (trigger) signal indicates whether the acquired data should be transferred to Data Capture Card (DCC) 103 or discarded. DCC 103 includes one or more DRAM modules 131 along with a DRAM controller 132, as FIG. 1 illustrates. Data sent to the DCC 103 from the trace array 102 are accepted by the DRAM controller 132, which then writes the data to the DRAM modules 131. Thus, the TCI provides two separate stages of data acquisition. One stage controls during which steps of a "major cycle" (fclk, DSTEP, etc.) data will be acquired by the trace array 102. Another stage controls whether the acquired data should be saved in the DCC 103.

The acquisition of data into the trace array 102 is controlled by several Hardware Control Bits (HCBs). HCBs are the mechanism that the compiler and the "virtual logic" uses to control various portions of the emulation hardware at runtime. Virtual logic 104 is emulated control logic that is compiled into the user's logic design. Although HCBs are generally set at compile time, they may be modified dynamically. Consistent with one embodiment, there are five HCBs used to control the TCI. One HCB is called the "trace_capture_enable" (TCE), illustrated in FIG. 1, which controls when data are captured by the trace array 102. On each step that the TCE signal is high, the 64 bits of data sent during that step from the processor clusters 101 are captured by the trace array 102. No data is stored during steps when TCE is low. This provides the flexibility to create separate, non-continuous capture windows. The data captured in a series of "major cycles" are referred to as a "frame." Generally, the trace array 102 can hold up to 4 frames of data: one frame being filled by the most recent capture data, another one or two frames waiting for a capture/discard decision, and a last frame unloading data to the DCC 103. However, it is contemplated that the trace array can hold any number of frames. As will be discussed further below, each of these frames is associated with a frame pointer. Another HCB called "Start_Frame" (SF) is set in one step of the first major cycle to indicate the beginning of a new frame.

Figure 2:
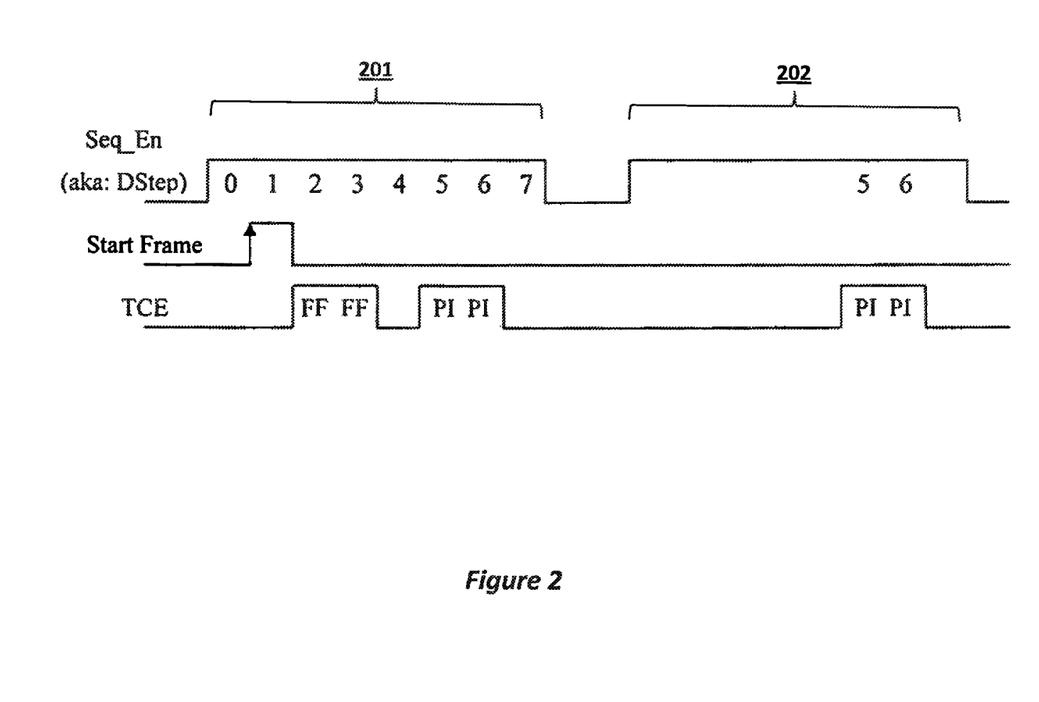
FIG. 2 illustrates an exemplary timing diagram that shows when data are captured by the trace array, according to one embodiment.

FIG. 2 illustrates an exemplary timing diagram that shows when data are captured by the trace array 102. As shown, a first major cycle 201 may span several (e.g., 8) emulation steps. During periods of the first major cycle 201 when TCE is high, the trace array 102 captures data including, but not limited to, flip-flop data values "FF FF" and primary input values "PI PI" (primary inputs are data values not generated by emulation processors 111). The "Start Frame" signal set to high during a step of the first major cycle 201 indicates the start of a new frame. During a second major cycle 202, primary input values "PI PI" are captured.

A frame of data that has been captured by the trace array 102 may be held there for up to two additional frames, until a logic trigger condition can be evaluated to indicate whether to store that frame of data to the DCC 103 or to discard it. A logic trigger condition is generally set by the user at compile time. The point at which the condition is met is the trigger point. This "conditional acquisition" is controlled by two HCBs, a "capture_current_frame" (CCF) bit and a "discard_current_frame" (DCF) bit. The rising edge of the CCF signal indicates to the trace array 102 to send a previous frame of data to the DCC 103 for storing. Alternatively, the rising edge of the DCF signal indicates to the trace array 102 to discard a previous frame of data. During every frame, a single rising edge of either, but not both, CCF or DCF must be asserted. Otherwise, an error may be flagged.

Figure 3:
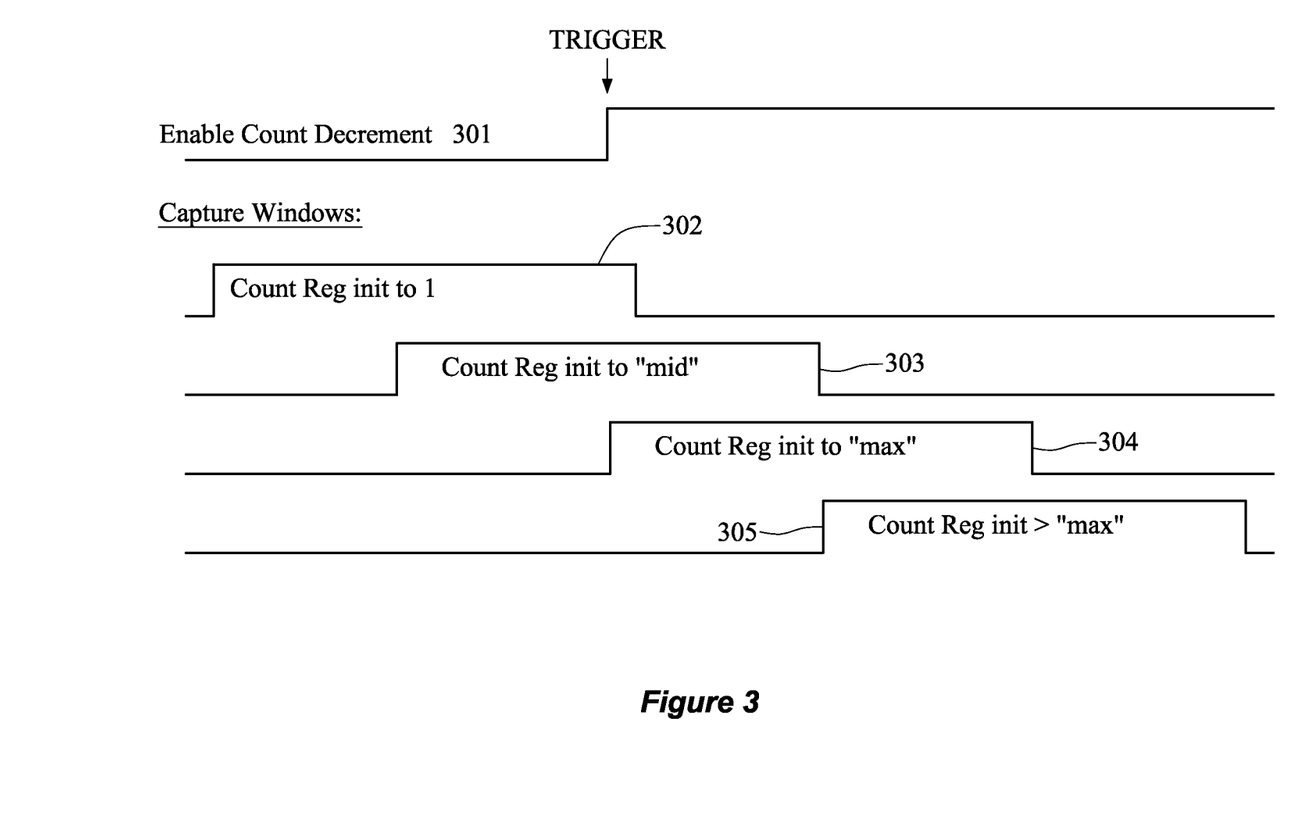
FIG. 3 illustrates the relative time positions of a capture window with respect to the trigger point, indicated by the rising edge of the "enable_count_decrement" (ECD) signal, according to one embodiment.

A fifth HCB is the "enable_count_decrement" (ECD) bit. The ECD bit goes high at the point when the logic trigger condition is met. A "DCC counter" register and an "Op complete" status bit are used along with the ECD to manage the transfer of data from the trace array 102. Depending on the value that is set in the DCC counter, data captured may be collected before, centered on, or after a logic trigger condition. FIG. 3 illustrates the relative time positions of a capture window with respect to the trigger point, indicated by the rising edge of the ECD signal 301. Setting the DCC counter to 1, the capture window 302 captures data before and approximately until the trigger point. Setting the DCC counter to a "mid", the capture window 303 is centered approximately around the trigger point and thus capture data before and after the trigger point. Setting the DCC counter to a "max", the capture window 304 begins capturing data approximately at the trigger point. The "mid" and "max" values are dependent on the memory size of the DCC DRAM (i.e. total size of all DRAM modules 131). The "max" value refers to the maximum size of the DCC DRAM while the "mid" value refers to half the maximum size of the DCC DRAM. Finally, setting the DCC counter to greater than "max", the capture window 305 begins capturing some time after the trigger point because the memory wraps (i.e., go back to the beginning of memory).

If the ECD bit is high for one or more emulation steps at any time during the capture of a frame, the DCC counter decrements by one when the last of that frame completely transfers from the trace array 102 to the DCC 103. When the DCC counter reaches 0, the DCC operation is complete and no additional data is stored in the trace array 102 or transferred to the DCC 103. Any additional data input from the trace array 102 is discarded, even if CCF is high. Data in the trace array 102 are "frozen" to allow reading by the run-time software. Also, when the DCC counter reaches 0, the "Op complete" status register is set.

Figure 4:
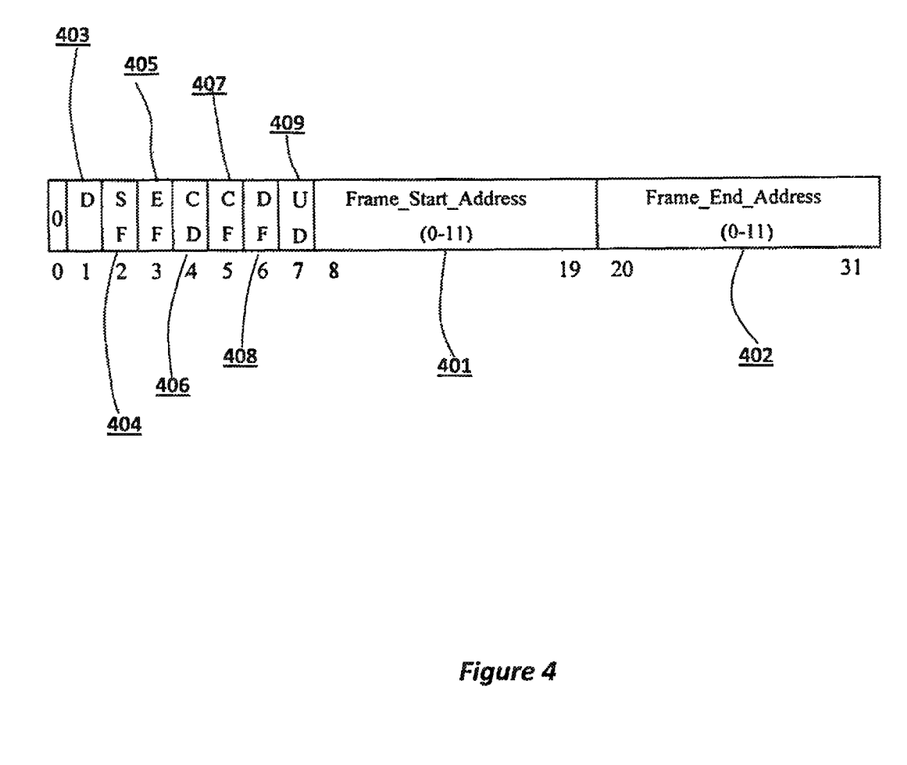
FIG. 4 illustrates an exemplary "frame status word", according to one embodiment.

As mentioned earlier, each frame in the trace array 102 is associated with a trace pointer. These trace pointers are stored in a trace point register and are used to indicate: which frame is currently being loaded with capture data (LOAD pointer), which frame is currently waiting for a capture/discard decision (CAPTURE/DISCARD pointer), and which frame is currently unloading data to the DCC 103 (UNLOAD pointer). Also associated with each frame of data in the trace array are "frame status word" registers. FIG. 4 illustrates an exemplary "frame status word", according to one embodiment. Each "frame status word" includes a frame_start_address field 401 and a frame_end_address field 402. Each "frame status word" also includes a set of status bits. For instance, status bit "D" 403 indicates whether any data samples have been captured in this frame and is set by the TCE. Status bit "SF" 404, which is set by Start_Frame HCB, indicates the start of this frame. Status bit "EF" 405 indicates whether this frame is complete and awaiting the capture or discard decision. Status bit "CD" 406 indicates whether the ECD bit was set during this frame. Status bit "CF" 407 indicates whether the CCF bit was set during this frame. Status bit "DF" 408 indicates whether the DCF bit was set during this frame. Status bit "UD" 409 indicates whether unload of the data to the DCC is in progress. A frame capture operation is initiated by the rise of the SF bit. When this happens, the LOAD pointer is incremented to the next frame number, the write address (i.e., address to write to on the trace array) is stored in the frame_start_address field of the "frame status word" register, and the SF bit 404 is set.

Figure 5:
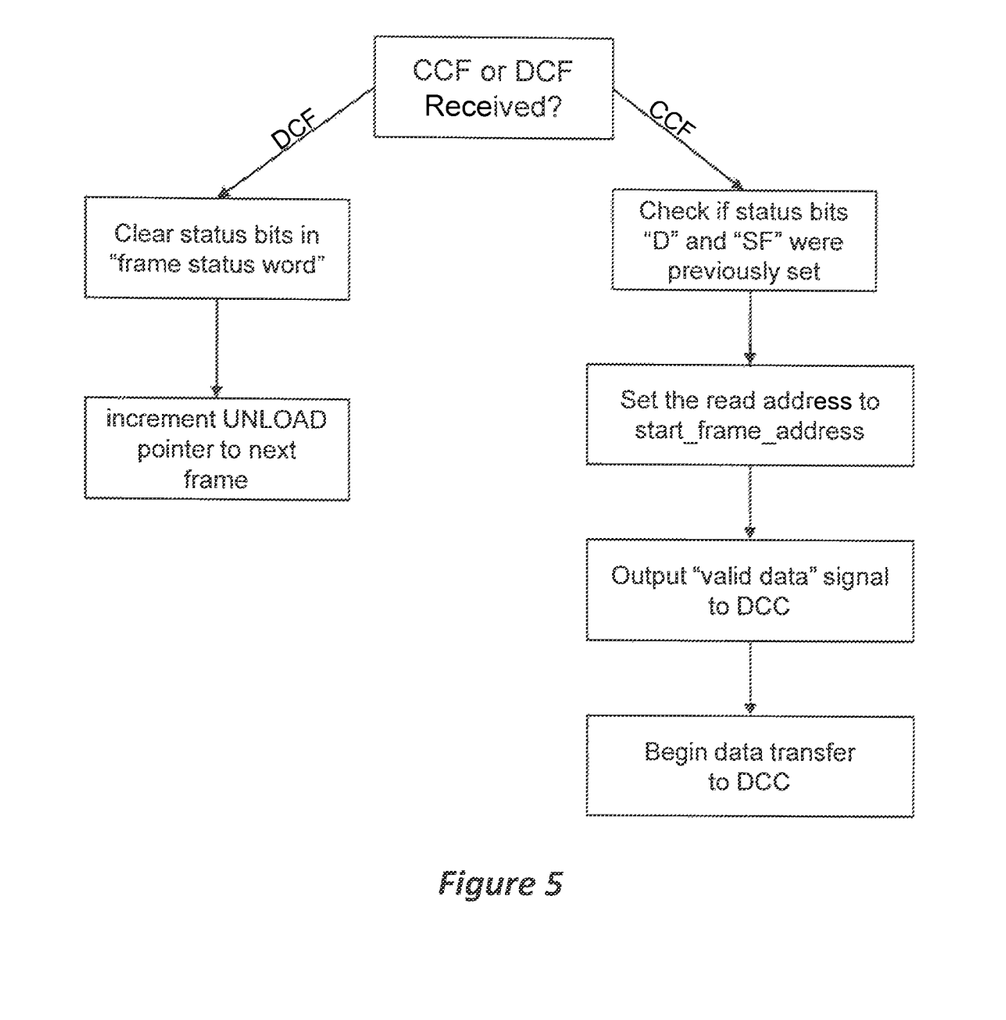
FIG. 5 illustrates an exemplary setup process for transferring data from the trace array to the data capture card (DCC).

When either the CCF or the DCF HCBs are received, the corresponding status bit of the frame_status_word is set. For instance, if the CCF is received, the "CF" status bit 407 is set and if the DCF is received, the "DF" status bit 408 is set. Also, when either CCF or DCF is received, the CAPTURE/DISCARD pointer is incremented to the next frame. After this point, the compiler is done with the operation, and the trace hardware takes over the process of transferring the frame of data from the trace array to the DCC. If the "DF" status bit 408 is set for this frame, all the status bits are cleared and the UNLOAD pointer is incremented to the next frame. If the CF status bit 407 is set, and the status bits "D" 403 and "SF" 404 were previously set, the read address will be set to correspond to the address in the frame_start_address field, a "valid_data" status that outputs to the DCC will be raised, and then the data from the trace array will be sent. FIG. 5 illustrates this transfer setup process. The transfer begins almost immediately and continues until the read address, which increments after each data word sent, reaches the address of the frame_end_address field. Once the last transfer of the last word is complete, the "valid_data" to the DCC is brought low, all the status bits are cleared, and the UNLOAD pointer is incremented to the next frame.

Embodiments and methods as described herein have significant advantages over prior art implementations. As will be apparent to one of ordinary skill in the art, other similar arrangements are possible within the general scope. The embodiments and methods described above are intended to be exemplary rather than limiting, and the bounds should be determined from the claims.

We claim:

1. An emulation method, comprising:
   emulating a user's logic design on an emulator chip comprising a trace array and a plurality of processor clusters each coupled with the trace array, wherein each processor cluster comprises a plurality of processors and a multiplexer coupled with each of the processors, wherein the multiplexer selects an output signal from one of the plurality of processors and outputs the selected output signal to the trace array;
   capturing a plurality of emulation data bits into a frame of the trace array during a first time window according to a first plurality of values of a first set of hardware control bits, wherein the first time window spans a first plurality of emulation steps;
   capturing a plurality of emulation data bits into the frame during a second time window according to a second plurality of values of the first set of hardware control bits, wherein the second time window spans a second plurality of emulation steps that are non-continuous with the first plurality of emulation steps; and
   selectively outputting the frame of data from the trace array based on a second set of hardware control bits, wherein the frame of data is one of the plurality of frames of data captured into the trace array.

2. The emulation method of claim 1, wherein the first set of hardware control bits includes a bit that indicates the start of a frame of emulation data bits.

3. The emulation method of claim 1, wherein the first set of hardware control bits includes a bit that indicates the beginning of the second time window for capturing emulation data bits into the trace array.

4. The emulation method of claim 1, comprising dynamically modifying the first set of hardware control bits by virtual hardware control logic.

5. The emulation method of claim 1, wherein the second set of hardware control bits includes a bit that indicates whether the frame of emulation data bits stored in the trace array is to be captured by a data capture card located off of the emulator chip.

6. The emulation method of claim 1, further comprising discarding a frame of the plurality of frames of emulation data bits stored in the trace array based on a bit in the second set of hardware control bits.

7. The emulation method of claim 1, wherein the second set of hardware control bits includes a bit that indicates a logic trigger condition set by a user at compile time.

8. The emulation method of claim 1, wherein the selectively captured frame of emulation data bits from the one or more frames of emulation data bits is stored on a data capture card, the method further comprising uploading the selectively captured frame of emulation data bits from the data capture card to a host workstation.

9. A hardware logic emulation system, comprising:
   an emulator chip onto which a user logic design can be mapped, the emulator chip comprising:
      a plurality of emulation processor clusters, an emulation processor cluster of the plurality of emulation processor clusters comprising a plurality of processors; and
      a multiplexer coupled to each of the emulation processors, wherein the multiplexer selects an output signal from one of the emulation processors during emulation of the user logic design, and outputs the selected signal to the trace array;
   a virtual hardware control logic configured to generate a first set of hardware control bits and a second set of hardware control bits during emulation; and
   a trace array comprising a memory and coupled to the output of the multiplexer configured to receive the selected output signal and selectively store the selected output signal into a plurality of frames of emulation data bits into the memory based on a first set of hardware control bits, wherein a frame of the plurality of frames of emulation data bits comprises a first plurality of emulation data bits captured during a first time window that spans a first plurality of emulation steps and a second plurality of emulation data bits captured during a second time window, non-continuous with the first time window, that spans a second plurality of emulation steps; and
   a data capture card that selectively captures a frame of the plurality of frames of data stored in the trace array based on the second set of hardware control bits.

10. The emulation system of claim 9, wherein the first set of hardware control bits includes a bit that indicates the start of the frame of emulation data bits.

11. The emulation system of claim 9, wherein the first set of hardware control bits includes a bit that indicates the beginning of the second time window for capturing emulation data bits to the trace array.

12. The emulation system of claim 9, wherein the first set of hardware control bits may be dynamically modified by the virtual hardware control logic.

13. The emulation system of claim 9, wherein the second set of hardware control bits includes a bit that indicates whether the frame of emulation data bits in the trace array is to be captured by the data capture card.

14. The emulation system of claim 9, wherein the second set of hardware control bits includes a bit that indicates whether the frame of emulation data bits in the trace array is to be discarded.

15. The system of claim 9, wherein the second set of hardware control bits includes a bit that indicates a logic trigger condition set by a user at compile time.

16. The system of claim 9, wherein the data capture card is adapted to store the frame of emulation data bits and output the stored frame of emulation data bits to a host workstation, and comprises:
   one or more DRAM modules; and
   a DRAM controller adapted to write to the one or more DRAM modules.

* * * * *